US012010920B2

(12) United States Patent
Wang et al.

(10) Patent No.: US 12,010,920 B2
(45) Date of Patent: Jun. 11, 2024

(54) 3D-PRINTED FERROELECTRIC METAMATERIAL WITH GIANT PIEZOELECTRICITY AND BIOMIMETIC MECHANICAL TOUGHNESS

(71) Applicant: Wisconsin Alumni Research Foundation, Madison, WI (US)

(72) Inventors: Xudong Wang, Middleton, WI (US); Jun Li, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 760 days.

(21) Appl. No.: 17/170,382

(22) Filed: Feb. 8, 2021

(65) Prior Publication Data

US 2022/0254985 A1 Aug. 11, 2022

(51) Int. Cl.
| | |
|---|---|
| H01L 41/08 | (2006.01) |
| C08K 3/04 | (2006.01) |
| C08K 3/11 | (2018.01) |
| H01L 41/18 | (2006.01) |
| H10N 30/045 | (2023.01) |
| H10N 30/057 | (2023.01) |
| H10N 30/50 | (2023.01) |
| H10N 30/85 | (2023.01) |

(52) U.S. Cl.
CPC ............. *H10N 30/852* (2023.02); *C08K 3/04* (2013.01); *C08K 3/11* (2018.01); *H10N 30/045* (2023.02); *H10N 30/057* (2023.02); *H10N 30/50* (2023.02)

(58) Field of Classification Search
CPC .......................... H10N 30/852; H10N 30/50
USPC ........................................................... 310/800
See application file for complete search history.

(56) References Cited

U.S. PATENT DOCUMENTS 5,925,973 A * 7/1999 Eda ...................... H03H 9/0595
310/366
6,469,421 B1 * 10/2002 Wakabayashi ..... H10N 30/8554
310/328

* cited by examiner

*Primary Examiner* — Derek J Rosenau
(74) *Attorney, Agent, or Firm* — Boyle Fredrickson S.C.

(57) ABSTRACT

An in-situ poled ferroelectric prints with true 3D geometry is provided with an intercalated electrode design where soft polymer matrixes are selected for the ferroelectric layers, and rigid polymer matrixes are selected for the electrode layers, thus mimicking nacre architecture with a ceramic-like piezoelectric property and bone-like fracture toughness. Lithium-doped potassium sodium niobite (Li—KNN) microparticles may be used to produce ferroelectric properties and to create strong interfacial bonding with the interfacing electrode layers. Polylactic acid (PLA) in the electrode layers may be used to facilitate strong interfacial bonding with the Li—KNN microparticles.

14 Claims, 3 Drawing Sheets

3D-PRINTED FERROELECTRIC METAMATERIAL WITH GIANT PIEZOELECTRICITY AND BIOMIMETIC MECHANICAL TOUGHNESS

STATEMENT REGARDING FEDERALLY SPONSORED RESEARCH OR DEVELOPMENT

This invention was made with government support under EB021336 awarded by the National Institutes of Health. The government has certain rights in the invention.

CROSS REFERENCE TO RELATED APPLICATION

Background of the Invention

The present invention relates to a synthetic ferroelectric material, and more particularly, a three dimensional (3D)-printed ferroelectric bulk material with large piezoelectric effect and fracture toughness.

Piezoelectric and ferroelectric materials have applications in human-machine interfacing, self-sustainable energy solutions, and therapeutic strategies. In these electromechanically coupled systems, strain remains an inevitable component. Therefore, mechanical or fracture toughness is an important prerequisite for these applications.

Soft piezoelectric materials and bio-piezoelectric materials can offer mechanical or fracture toughness but do not offer high piezoelectric responses. On the other hand, piezoceramic materials can offer high piezoelectric responses but do not offer mechanical or fracture toughness since they are typically brittle, rigid, and hard to shape.

3D printing is a manufacturing technique that can create complex non-planar 3D geometries. In-situ poling during 3D printing can directly create ferroelectric prints with aligned polarity. 3D printed piezoelectric materials have been developed, such as photo-resins incorporating ferroelectric polymers and ceramics, writing inks consisting of volatile solution and ferroelectric solute, and thermoplastic filaments made of ferroelectric components. However, these piezoelectric prints are usually two dimensional (2D) or two and a half dimensional (2.5D) with low print fidelity.

For example, a piezoelectric material from lead zirconate titanate (PZT) composite may be 3D printed with a piezoelectric coefficient ($d_{33}$) of 110 pC/N. However, the fabrication of this material requires high electric field post-fabrication poling, resulting in excessive fabrication time and limited size and dimensionality. In another example, a piezoelectric material from potassium sodium niobite (KNN) composite may be 3D printed as described in U.S. application Ser. No. 16/851,400, entitled "3D Printed and In-Situ Poled Flexible Piezoelectric Pressure Sensor," assigned to the present applicant and hereby incorporated by reference. However, the fabrication of this material requires a large electric field to be applied as the build height increases, therefore, the size of the material remains largely 2D.

SUMMARY OF THE INVENTION

The present inventors recognize that in order to achieve rapid and consistent dipole alignment during high temperature 3D printing, the printing materials need to possess a high curie temperature (Tc) and desirably the poling voltage is kept constant without having to be scaled with the object's height dimension. In order to create in-situ poled ferroelectric prints with true 3D geometry, the present invention provides an intercalated electrode design where soft polymer matrixes are selected for the ferroelectric layers, and rigid polymer matrixes are selected for the electrode layers, thus mimicking nacre architecture with a ceramic-like piezoelectric property and bone-like fracture toughness.

In one embodiment of the present invention, lithium-doped potassium sodium niobite (Li—KNN) microparticles are used to produce ferroelectric properties and create strong interfacial bonding with the interfacing electrode layers. Polylactic acid (PLA) in the conductive electrode layers may be used to facilitate strong interfacial bonding with the Li—KNN microparticles.

In one embodiment of the present invention, a soft ferroelectric composite layer of Li—KNN microparticles mixed with poly(vinylidene fluoride)-co-hexafluoropropylene (PVDF-HFP) polymer is interlayered with a hard-composite electrode layer formed of PLA blended with carbon black (CB). The soft ferroelectric composite layer and the hard-composite electrode layer are directly printed with in-situ poling of the ferroelectric composite layer in alternating soft and hard layers. The printed piezoelectric material provides a very high $d_{33}$ of at least 130 pC/N (comparable to conventional piezo-ceramics) along with bone-like mechanical toughness of at least 5.5 MPa*m$^{1/2}$ (more than three times higher than conventional piezo-ceramics).

In one embodiment of the present invention, a method of 3D printing a bulk piezoelectric material delivers in-situ poling by creating an electric field between the nozzle and the lower supporting electrode, and aligning the dipoles in the just-printed extruded ferroelectric material in-situ giving rise to a large net polarization. The interface between the soft ferroelectric composite layer and the hard conductive composite layer form strong hydrogen bonds between hydrogen atoms and electronegative atoms, achieving strong interfacial adhesion. By introducing removable conductive electrical buses to each of the electrode layers during 3D printing, a constant voltage can be applied to the just-printed extruded ferroelectric layer regardless of the number of layers of ferroelectric material that are built on the print bed. Therefore, the polarization of each ferroelectric layer is independently controlled despite the number of layers or build height of the piezoelectric structure.

In one embodiment of the present invention, a piezoelectric material includes a structure or substrate having alternating layers of ferroelectric material and conductive material alternated along a build axis, a first electrode connected to at least a first layer of conductive material, and a second electrode connected to at least a second layer of conductive material different from the first layer of conductive material. The ferroelectric material is poled in a direction along the build axis. The ferroelectric material and conductive material are hydrogen bound by fundamentally electrostatic interactions between atoms to provide an interface that is at least as strong as the materials individually.

It is thus one feature of at least one embodiment of the present invention to utilize alternating hard and soft layers to mimic the soft bio-adhesive and tough aragonites in nacre, respectively, as the building blocks to construct a lamellar heterostructure.

All layers of the ferroelectric material may have the same poling polarity, and the first and second electrodes are top and bottom layers of conductive material.

It is thus one feature of at least one embodiment of the present invention to increase the voltage output of the material by aligning the ferroelectric layers in series.

All alternate layers of the ferroelectric material may have opposite poling polarity and the first and second electrodes are every other layer.

It is thus one feature of at least one embodiment of the present invention to increase the current output of the material by aligning the ferroelectric layers in parallel.

The ferroelectric material may have a piezoelectric coefficient of at least 130 pC/N at room temperature and the conductive material may be at least twice as conductive as the ferroelectric material.

It is thus one feature of at least one embodiment of the present invention to provide high piezoelectric effect by utilizing (and adding the effect of) multiple layers of 3D printed piezoelectric material with piezoelectric properties.

The ferroelectric material may have a fracture resistance of at least 5.5 MPa*m$^{1/2}$.

It is thus one feature of at least one embodiment of the present invention to select a soft piezoelectric material (intercalated with hard electrode layers) with high elastic modulus that can provide mechanical toughness, durability and strain toughness to the overall substrate.

The ferroelectric material may comprise ferroelectric particles embedded in a polymer matrix. The ferroelectric particles may be KNN or Li—KNN. The polymer matrix may be PVDF-HFP.

It is thus one feature of at least one embodiment of the present invention to provide a material with high piezoelectric effect but desired flexibility and softness.

The conductive material may comprise conductive particles embedded in a polymer matrix. The polymer matrix may be configured to hydrogen bond with hydroxyl groups of the ferroelectric material.

It is thus one feature of at least one embodiment of the present invention to prevent separation between the hard and soft layers of the substrate by providing strong interfacial bond.

The polymer matrix may be polylactic acid (PLA). The conductive particles may be carbon particles.

It is thus one feature of at least one embodiment of the present invention to use the conductive properties of the electrode layers to poll the growing ferroelectric material by applying a lower voltage without diminished poling effect.

An electrical load may electrically connect to the first and second electrodes and configured to receive a voltage between the first and second electrodes.

It is thus one feature of at least one embodiment of the present invention to provide energy harvesting capability that may use the piezoelectric structure as a self-powering energy source.

The ferroelectric material may have a tensile or compressive modulus that is at least three times lower than the conductive material.

It is thus one feature of at least one embodiment of the present invention to utilize the much softer ferroelectric material (compared to the hard electrode layer) to uniformly concentrate strain on the ferroelectric layers when subjected to mechanical stimuli, and therefore, the ferroelectric layers contribute equally to piezoelectric response.

In one embodiment of the present invention, a method of 3D printing a substrate of piezoelectric material includes the steps of extruding a conductive material through a first nozzle, depositing the conductive material onto an upper surface of a build plate, extruding a composite ferroelectric material through a second nozzle, depositing the composite ferroelectric material onto the conductive material, repeating the steps of extruding and depositing the conductive material and composite ferroelectric material in alternating layers, and applying a charge to the second nozzle and the build plate to create an electric field such that the composite ferroelectric material is poled perpendicular to an upper surface of the build plate. The layers of conductive material are electrically connected to the build plate as the layers of conductive material are applied to produce an electric field between the second nozzle and the electrically connected layers of conductive material. The strength of the applied voltage may be independent of the number of layers of ferroelectric material.

It is thus one feature of at least one embodiment of the present invention to create a constant electric field as the build height and number of layers increases without increasing the voltage, thus eliminating the need for high voltage application and without adversely affecting polarization of the ferroelectric material.

The electrical connection between the layers of conductive material may be removed following printing.

It is thus one feature of at least one embodiment of the present invention to increase the piezoelectric effect of the substrate by aligning the ferroelectric layers along the axis of the substrate build.

The step of applying a voltage may switch a polarity of the electric field for adjacent layers of ferroelectric material.

It is thus one feature of at least one embodiment of the present invention to increase the total output charge of the piezoelectric material by arranging the ferroelectric layers in parallel.

The step of applying a voltage may keep a same polarity of the electric field for adjacent layers of ferroelectric material.

It is thus one feature of at least one embodiment of the present invention to increase the total voltage of the piezoelectric material by arranging the ferroelectric layers in parallel.

These particular objects and advantages may apply to only some embodiments falling within the claims and thus do not define the scope of the invention.

DETAILED DESCRIPTION OF THE PREFERRED EMBODIMENT

Figure 1:
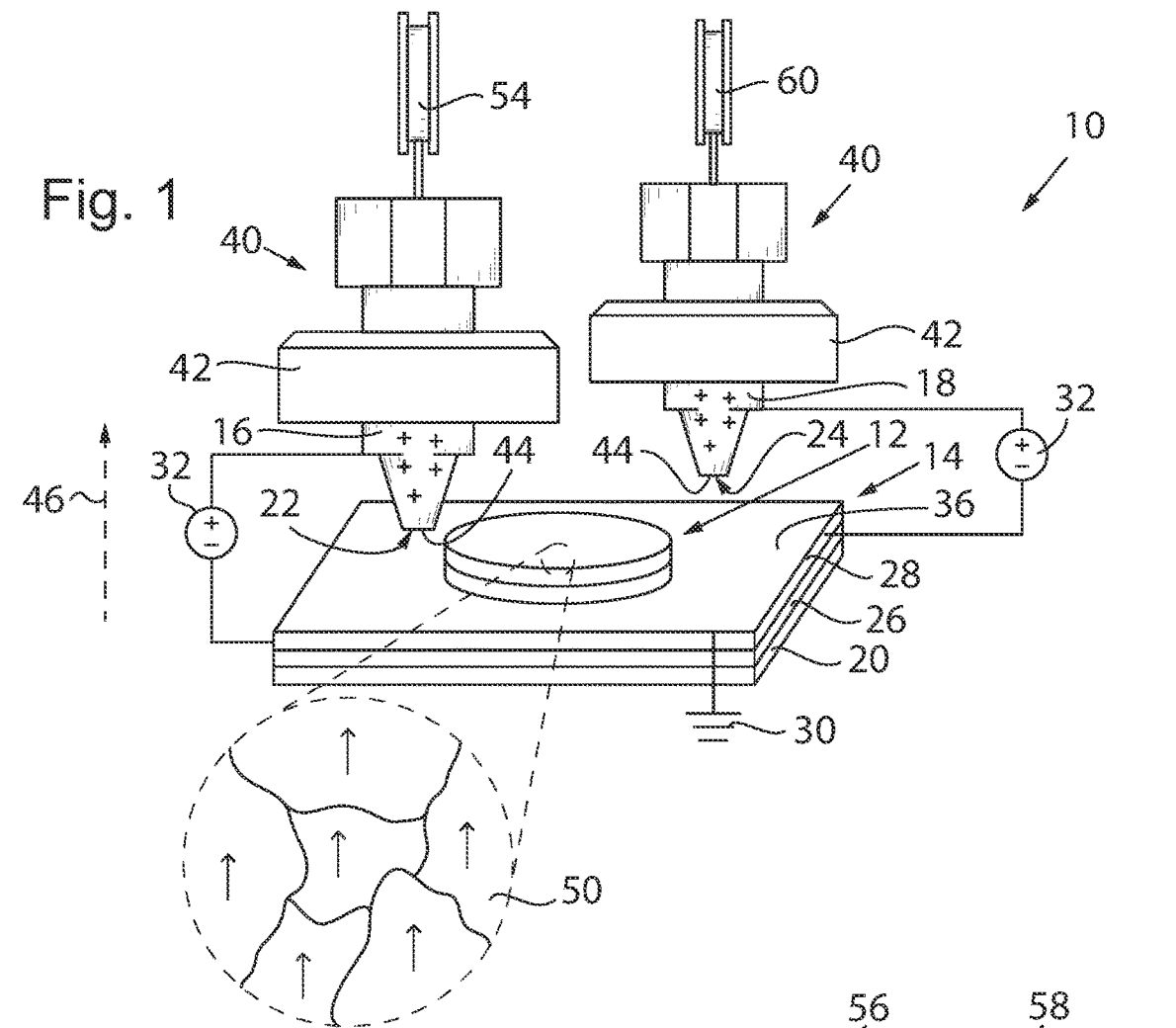
FIG. 1 is a schematic representation of one embodiment of the present invention showing an apparatus and method of printing a piezoelectric bulk substrate where the conductive composite layer and the ferroelectric composite layer are alternatingly extruded onto the print bed and the ferroelectric composite is poled simultaneously with 3D printing extrusion.

Referring to FIG. 1, a three-dimensional (3D) printing system 10 of the present invention for fused deposition modeling (FDM) may be used with an electric in-situ poling process in the manufacture of a piezoelectric bulk structure 12. The piezoelectric bulk structure 12 may be a 3D multi-layer bulk piezoelectric material 12 as further described below.

The 3D printing system 10 may include a build plate 14 providing a substantially planar surface on which an extruded molten material is deposited, layer by layer, during 3D printing. The build plate 14 may be moved vertically up and down, for example, lowered as the layers are added and translated in all directions within a plane of the build plate 14 to assist with building the desired shape of the printed object as is generally understood in the art. The build plate 14 may have a surface area of at least five by five by five (5×5 inches) providing enough surface area to build the printed object.

The build plate 14 may include multiple layers or planar sheets that are used to heat and/or support the extruded material but are also able to produce an electric field between the build plate 14 and at least one of a pair of print nozzles 16, 18 used to pole the extruded material as the molten material is deposited onto the build plate 14.

The build plate 14 may include a heat bed 20, forming a lowermost layer of the build plate 14, which provides an electric resistance heater and a conductive material that keeps the extruded molten material 22, 24 on the build plate 14 warm to prevent warping, for example, which may occur if the extruded molten material 22, 24 is cooled too quickly. The electric resistance heater, as understood in the art, generates heat that is conducted to the conductive material of the heat bed 20. In some embodiments, the conductive material may be an aluminum or glass plate.

An upper surface of the heat bed 20 may be optionally covered by a glass plate 26 that does not warp or bend under heat and provides a smooth upper surface, particularly when the heat bed 20 itself does not provide a smooth upper surface. In some embodiments, the heat bed 20 itself may include an upper surface of glass, for example, a tempered glass, removing the necessity for the glass plate 26 to cover the heat bed 20. Generally, the desired characteristics of the material of the glass plate 26, if included, or upper surface of glass of the heat bed 20 are hard and rigid, high modulus of elasticity, and thermally stable (low thermal conductivity).

The glass plate 26, if included, or upper surface of glass of the heat bed 20, will support an electrode layer 28, for example a copper foil, serving as a cathode or anode of the electrical field assembly and may be connected to ground 30 or a voltage source 32. The first nozzle 16 may serve as the other of the anode or cathode of the electrical field assembly and may also be connected to ground 30 or the voltage source 32. The first nozzle 16 and the electrode layer 28 produce an electric field, as further described below, to pole the ferroelectric molten material 22 extruded through the first nozzle 16. The second nozzle 18 may be used to extrude the conductive molten material 24 and may also be connected to the voltage source 32 to optionally create an electric field between the conductive molten material 24 extruded through the second nozzle 18 and the electrode layer 28 in order to stabilize the dipole in the previously printed ferroelectric molten material 22 where normally the high temperature of the conductive molten material 24 might disrupt the dipole in the previously printed ferroelectric molten material 22. The voltage source 32 of the second nozzle 18 may be the same or a different voltage source connected to the first nozzle 16.

An upper surface of the electrode layer 28 may include an adhesion layer 36 to assist with the adhesion of the extruded molten material 22, 24 to the upper surface of the uppermost layer of the build plate 14. The adhesion layer 36 may be a thin layer of polyvinyl alcohol (PVA) hydrogel such as Elmer's glue stick, Kapton tape, masking tape or the like enhancing the adhesion of the lowermost print layer to the build plate 14. The adhesion layer 36 may have a thickness that is less than 50 micrometers.

The 3D printing system 10 may further include one or more filament extruders 40 associated with the pair of nozzles 16, 18, respectively, and including feeding rollers that are driven by motors to drive filaments downward through the one or more filament extruders 40 and into the pair of nozzles 16, 18 of the filament extruders 40.

The pair of nozzles 16, 18 may be heated by heaters 42, such as a thermistor, thermocouple, or the like mounted to the filament extruders 40 and heating the pair of nozzles 16, 18 to further melt the filaments as they are driven through the pair of nozzle 16, 18, respectively, to dispel the molten material 22, 24 in liquid form. The heaters 42 may heat the pair of nozzle 16, 18, and therefore, the filaments to a temperature of at least 230 degrees Celsius, and at least 250 degrees Celsius, and between 230-290 degrees Celsius to cause the filaments to properly melt and properly extrude the molten material 22, 24 through the conical-shaped nozzles 16, 18 without clogging. The pair of nozzles 16, 18 may be manufactured of a heat and electrically conductive material such as brass, stainless steel, and hardened steel allowing for melting of the filaments and the poling processes further described below.

The molten material 22, 24 may be expelled out through lower hole openings 44 of the pair of nozzles 16, 18, respectively, and then deposited onto the top of the build plate 14 and on top of the build material. The lower hole openings 44 of the pair of nozzles 16, 18 may have a diameter ranging from 0.1 mm to 1 mm.

The one or more filament extruders 40 of the 3D printing system 10 may be moved vertically up and down, thus raising the pair of nozzles 16, 18 as the build layers are added, and translating in all directions parallel to the plane of the build plate 14 to assist with building the desired shape of the printed object as understood in the art.

The ferroelectric molten material 22 may be poled as it is extruded through the first nozzle 16. Electric poling occurs at temperatures below the Curie point, when the crystal structures cause an electric dipole to be created, by aligning all of the individual dipole moments so that they all point in the same direction. This is accomplished by putting the crystal in a constant electric field to force the dipoles to align. When the electric field is removed, the dipoles roughly remain aligned.

As the ferroelectric molten material 22 is extruded through the first nozzle 16, an electrical field is created between the electrode layer 28 and the first nozzle 16 to pole the ferroelectric molten material 22 as it is being extruded, causing polarization of the ferroelectric molten material 22 as it is deposited onto the build plate 14. To pole the ferroelectric molten material 22, an adjustable electric field in the range of 0.5 to 4 kV/mm is created between the electrode layer 28 and the first nozzle 16 extending along a poling axis 46 perpendicular to the build plate 14. The electric field is created by the voltage source 32 having an output voltage up to 30 kV (10 W).

The direction of poling along the poling axis 46 dictates the polarity of the ferroelectric molten material 22, therefore, the anode and cathode may be switched to change the polarity of the ferroelectric layer and without affecting the strength of the electric field or the piezoelectric effect of the resulting printed piezoelectric bulk structure 12. For example, a positive electrode of the high voltage source 32 may be connected to the first nozzle 16. The polarity of the high voltage source 32 may be switched so that the positive electrode of the high voltage source 32 may be connected to the electrode layer 28. The poling of the ferroelectric molten material 22 causes the dipoles of the printed piezoelectric bulk structure 12 to orient in the same direction, leading to a piezoelectric effect of the ferroelectric molten material 22.

The electric field can be created at elevated temperatures, for example, at least 230 degrees Celsius, and at least 250 degrees Celsius, and between 230-290 degrees Celsius, and at temperatures required to properly melt the filament. At these elevated temperatures, it would normally be expected that the ferroelectric molten material 22 would exhibit a significantly lower coercive force, therefore, requiring the ferroelectric molten material 22 to cool prior to effective poling application. However, the concentrated electric field and high processing temperature are favorable for aligning the ferroelectric dipoles in the ferroelectric molten material 22. Thus, the ferroelectric molten material 22 is poled simultaneous with extrusion onto the build plate 14 and eliminating the need for separate 3D printing and poling steps.

The conductive molten material 24 is extruded onto the build plate 14 in a similar manner as the ferroelectric molten material 22. As the conductive molten material 24 is extruded through the second nozzle 18, an electrical field may be created between the second nozzle 18 and electrode layer 28 (or lower electrode layer) to stabilize the dipole in the ferroelectric molten material 22 therebelow as the conductive molten material 24 is deposited onto the ferroelectric molten material 22. To keep the dipole in ferroelectric molten material 22, an adjustable electric field in the range of 0.5 to 4 kV/mm is created between the second nozzle 18 and the electrode layer 28 (or lower electrode layer) and extending along the poling axis 46 perpendicular to the build plate 14. The electric field is created by the voltage source 32 having an output voltage up to 30 kV (10 W). The electric field applied to the conductive molten material 24 stabilizes the dipole in the ferroelectric molten material 22 when normally the high temperature of the conductive molten material 24 might disrupt the dipole in the ferroelectric molten material 22 below the conductive molten material 24.

The printing rate of the extruded molten material 22, 24 is desirably less than 20 mm/s, and less than 15 mm/s, and less than 10 mm/s which allows for sufficient poling time and improved dipole alignment than would occur at a faster printing rate, for example, higher than 20 mm/s.

The extruded molten material 22, 24 may be deposited onto the build plate 14 and on the top of the build layer-by-layer with each layer having a thickness of approximately 0.3 mm to 0.5 mm (300 μm to 500 μm) and approximately 0.4 mm (400 μm). The extruded molten material 22, 24 may be deposited onto the build plate in an alternating manner by switching between the first nozzle 16 and second nozzle 18 to form alternating layers of the extruded molten material 22, 24. The extruded molten material 22 may be a ferroelectric composite 50 and the extruded molten material 24 may be a conductive composite 52 as further described below.

Figure 2:
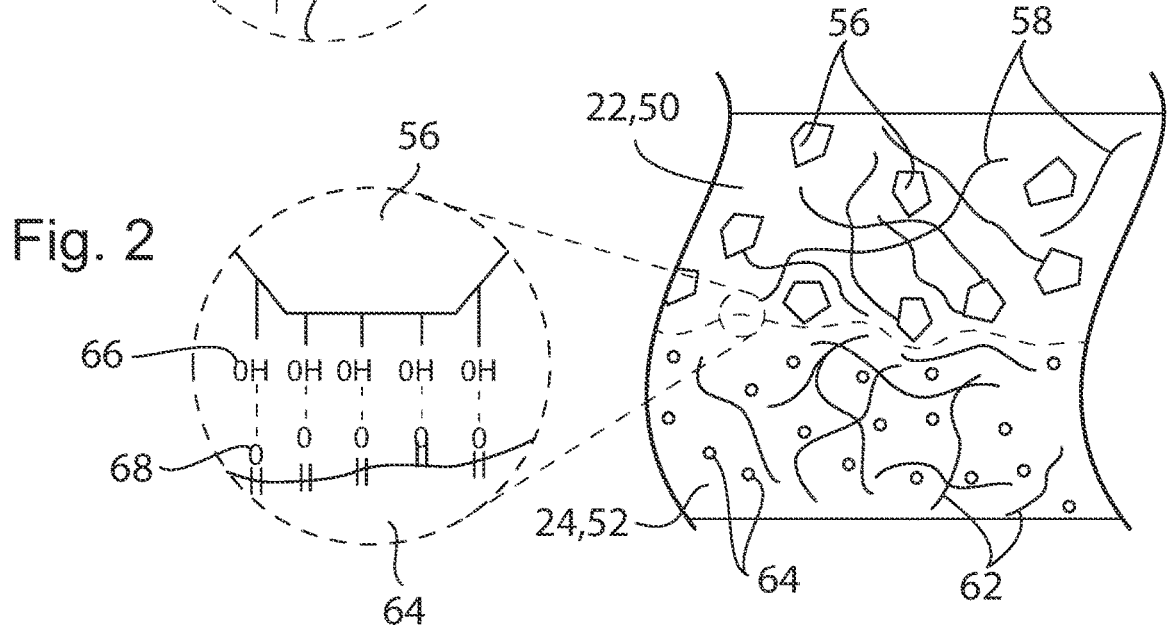
FIG. 2 is a schematic representation of the interface between the conductive composite layer and the ferroelectric composite layer of FIG. 1 with oxygen (O) atoms of the conductive layer bonding with the hydroxide (OH$^-$) groups of the piezoelectric composite layer.

Referring now to FIGS. 1 and 2, a first filament 54 may be used in the printing process described above to form the ferroelectric molten material 22 and the ferroelectric composite 50 of the piezoelectric bulk structure 12. The first filament 54 may be a matrix of ferroelectric material or particles embedded in a polymer. For example, the ferroelectric material or particles may be potassium sodium niobite (KNN), lead zirconia titanate (PZT), lithium niobate (LiNbO$_3$), and the like. In one embodiment of the present invention, the first filament 54 is a matrix of ferroelectric KNN or KNN-based piezoceramic particles 56 embedded in a ferroelectric polyvinylidene fluoride (PVDF) or PVDF-based polymer 58. The KNN-based piezoceramic particles may include KNN, Li/Sn/Ta-doped KNN, KNN-ABO3 solid solution, and the like. The PVDF-based polymer may include PVDF, PVDF-HFP, PVDF-TrFE, PVDF-CTFE, other PVDF-copolymers, and the like.

The KNN-based piezoceramic particles 56 are a group of high performance, lead-free ferroelectric ceramics. The KNN-based piezoceramic particles 56 possess high piezoelectric properties and have a $d_{33}$ coefficient of approximately 100 pC/N and between 80-400 pC/N at room temperature, and a high Curie temperature of at least 270 degrees Celsius and at least 300 degrees Celsius and at least 400 degrees Celsius and between 435-445 degrees Celsius and approximately 440 degrees Celsius, which assist the composite material in maintaining its ferroelectric phase during high temperature 3D printing. The KNN-based piezoceramic particles 56 have a high dielectric permittivity of approximately 200 at 10 kHz at room temperature. The KNN-based piezoceramic particles 56 may generate a stable piezoelectric peak-to-peak voltage output ($V_{pp}$) of approximately 20 V and a short-circuited current of approximately 30 μA under an external force load of 30 N peak load. The KNN-based piezoceramic particles 56 are also biocompatible.

The KNN-based piezoceramic particles 56 may be prepared with a dopant, such as lithium (Li) to improve the piezoelectric properties of the KNN-based piezoceramic particles 56 at room temperature. Other known dopants may be added to the KNN-based piezoceramic particles 56 to improve the piezoelectric properties, for example, tin (Sn) and tantalum (Ta). The KNN-based piezoceramic particles 56 may be further modified to add hydroxyl(OH$^-$) groups 66 onto the surface making the KNN-based piezoceramic particles 56 more compatible with the PVDF-based polymer 58 matrix.

The PVDF-based polymers 58 are a group of soft thermoplastic polymers with high printability, flexibility, and acceptable piezoelectricity. The PVDF-based polymers 58 possess piezoelectric properties and have a $d_{33}$ coefficient of approximately 20 pC/N at room temperature, and a Curie temperature of between 190 and 200 degrees Celsius and approximately 195 degrees Celsius, which assist the composite material in maintaining its ferroelectric phase during high temperature 3D printing. The PVDF-based polymers 58 have a high dielectric permittivity of approximately 12 at 10 kHz at room temperature. The PVDF-based polymers may generate a stable piezoelectric peak-to-peak voltage output ($V_{pp}$) of approximately 3V and a short-circuited current of approximately 100 nA under an external force load of 30N peak load. The PVDF-based polymers 58 are also biocompatible. The PVDF-based polymers 58 have low electrical conductivity.

The addition of the copolymer hexafluoropropylene (HFP) to PVDF-based polymers 58 assists with lowering the crystallinity of the PVDF-based polymers 58 minimizing stress build up due to crystallization. For example, the crystallinity of HFP-PVDF is approximately 23.4% while the crystallinity of PVDF is approximately 60.2%. The lower crystallinity of the PVDF-based polymers 58 helps to prevent curling of the printed substrate. Other co-polymers that may be used to lower the crystallinity of the PVDF-based polymers 58 include TrFE and CTFE.

In a preferred embodiment of the present invention, the first filament 54 may be made of a mixture of lithium-doped potassium sodium niobite (Li—KNN) microparticles embedded in a poly(vinylidene fluoride)-co-hexafluoropropylene (PVDF-HFP) polymer. The Li—KNN may be at least 35 vol % and between 30 vol % and 40 vol %.

A second filament 60 may be used in the printing process described above to provide the conductive molten material 24 and the conductive composite 52 of the piezoelectric bulk structure 12. The second filament 60 may be conductive nanoparticles, inks, pastes, composites and the like embedded in a PLA-based polymer 64 to produce a conductive network. In a preferred embodiment, the second filament 60 may be carbon-based nanoparticles 62 embedded in PLA-based polymer 64. Other conductive particles that may be used in place of carbon-based nanoparticles 62 include silver, copper, gold, magnesium, zinc, manganese nanoparticles or other forms such as nanowires.

The PLA-based polymers 64 are thermoplastic polyesters that are non-conductive, insulating, and temperature resistant. The PLA-based polymers 64 provide exposed oxygen (O) atoms 68 that are able to bind with the hydroxyl groups 66 of the surface modified KNN-based piezoceramic particles 56 of the first filament 54. Other polymers that may replace the PLA-based polymers 64 include poly(lactic-co-glycolic acid) (PLGA), Polyether ether ketone (PEEK), Polyethylene terephthalate glycol (PETG) and other thermoplastics with a carbonyl group.

Carbon-based nanoparticles 62 may include a conductive type of carbon that imparts electrical conductivity to the polymer matrix. The electrical conductivity of the carbon-based nanoparticles 62 may be at least twice as conductive as the ferroelectric composite 50. The conductive composite 52 may have a conductivity of at least 5 S/m and at least 6 S/m and at least 6.34 S/m. The carbon-based nanoparticles 62 have a diameter of approximately 100 nm dispersed evenly in the PLA-based polymer 64 to form a conductive network. The carbon-based nanoparticles 62 may be at least 10 vol %. It is understood that other carbon nanostructures may be used to impart electrical conductivity such as carbon nanotubes, graphene and the like. In a preferred embodiment of the present invention, the carbon-based nanoparticles 62 may be carbon black (CB) nanoparticles.

As seen in FIG. 2, the layers of ferroelectric composite 50 and conductive composite 52 interface to form strong hydrogen bonds therebetween. The hydrogen bonds are defined by hydrogen atoms located between a pair of other atoms having a high affinity for electrons. Specifically, the PLA-based polymer 64 provides exposed oxygen (O) atoms 68 that may hydrogen bond with the exposed hydroxyl(OH⁻) groups 66 of the KNN-based piezoceramic particles 56 thus achieving strong interfacial adhesion. The O atoms 68 (hydrogen bond donor) is bonded to a hydrogen atom of the OH— groups 66 (hydrogen bond acceptor).

At the interface, the Li—KNN micro-particles are seen to penetrate the conductive composite 52 demonstrating strong adhesion between the layers. No detachments or pores is found between the layers. The adhesion force at the PVDF-HFP/Li—KNN and PLA/CB interface is approximately 21 N which is ten times higher than the interface of the PVDF-PLA/CB interface. The adhesion energy at the PVDF-HFP/Li—KNN and PLA/CB interface is approximately 4.06 J/mm². The adhesion force or bonding energy of the PVDF-HFP/Li—KNN and PLA/CB interface is at least as strong as the PVDF-HFP/Li—KNN or PLA/CB layers individually.

The low crystallinity of the PVDF-based polymer 58 and the PLA-based polymer 64 help to avoid layer detachment of the PVDF-HFP/Li—KNN and PLA/CB interface caused by strain build-up due to crystallization during cooling down.

Figure 3:
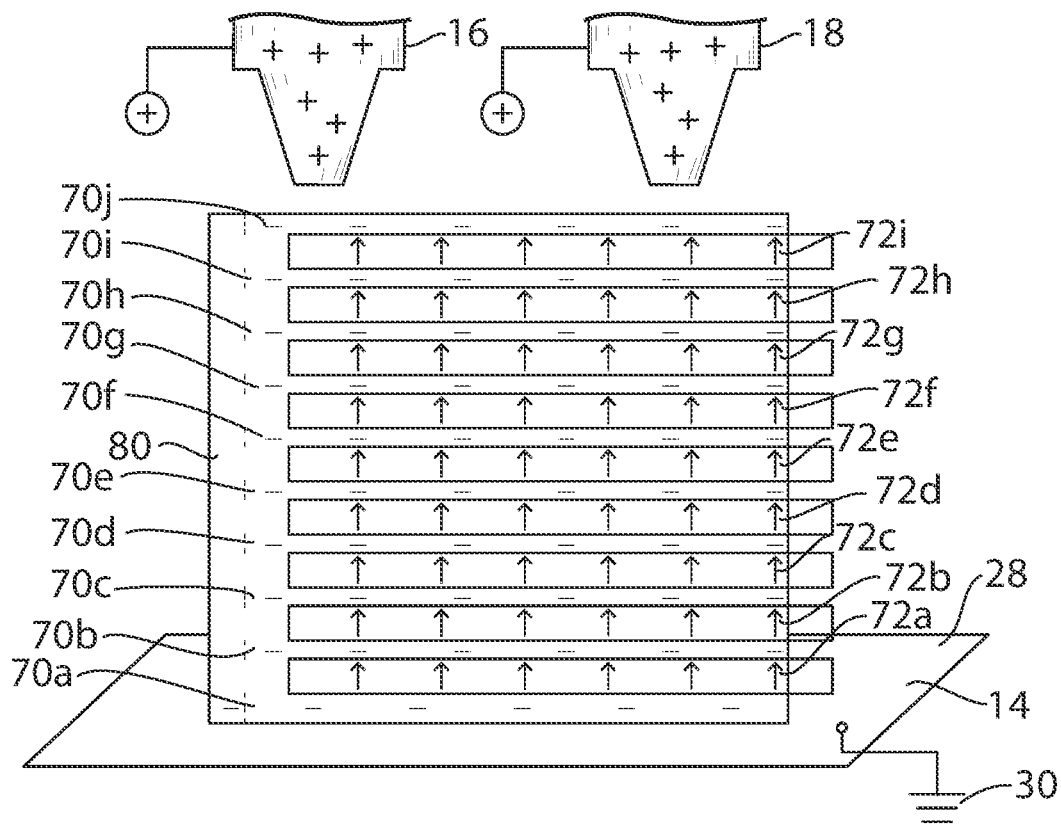
FIG. 3 is a schematic representation of multiple layers of the conductive composite and ferroelectric composite being alternatingly deposited onto the print bed and the ferroelectric composite being in-situ poled by applying a potential difference between the print nozzle and the bottom conductive layer and electrically connecting the conductive composite layers via an electrical bus.

Referring to FIG. 1 and FIG. 3, in one embodiment of the present invention, the piezoelectric bulk structure 12 may be manufactured by the following process to produce in-series connection of each ferroelectric layer 72 or piezoelectric unit.

The first filament 54 of ferroelectric composite 50 and the second filament 60 of conductive composite 52 may be loaded into the first and second nozzle 16, 18, respectively, of the 3D printing system 10.

Initially, the second nozzle 18 may deposit a bottom electrode layer 70a onto the conductive electrode layer 28 of the build plate 14. The bottom electrode layer 70a and the conductive electrode layer 28 electrically communicate, for example, a positive voltage or negative voltage, to conduct a charge between the bottom electrode layer 70a and the conductive electrode layer 28. In this example, it will be assumed that the build plate 14 is always negative with respect to the second nozzle 18 but it will be appreciated that the reverse polarity may also be adopted. A charge may not be applied to the second nozzle 18 in the deposition of the bottom electrode layer 70a.

Next, the first nozzle 16 may deposit a second ferroelectric layer 72a printed on the top of the bottom first electrode layer 70a. While the second ferroelectric layer 72a is printed on the top of the bottom first electrode layer 70a, an electric field is created between the first nozzle 16 and the bottom electrode layer 70a. Facilitated by the high nozzle temperature, the electric field quickly aligns the dipoles in the just extruded material in-situ, giving rise to a large net polarization in the second ferroelectric layer 72a.

At the interface of the bottom electrode layer 70a and the second ferroelectric layer 72a, the hydroxyl surface of KNN in the ferroelectric layer 72a forms hydrogen bonds with the PLA in the bottom electrode layer 70a forming a strong bond.

Next, the second nozzle 18 may deposit a third electrode layer 70b onto the second ferroelectric layer 72a. While the third electrode layer 70b is printed on the top of the second ferroelectric layer 72a, an electric field is created between the second nozzle 18 and the bottom electrode layer 70a in order to keep the dipole in the second ferroelectric layer 72a. The third electrode layer 70b, the bottom electrode layer 70a, and the conductive electrode layer 28 electrical communicate, for example, a negative voltage.

The deposition and poling of alternating layers of ferroelectric composite 50 and conductive composite 52 is repeated to build an alternating layered piezoelectric bulk structure 12 with each of the ferroelectric layers 72 having aligned polarities. In this respect, a fourth ferroelectric layer 72b may be built on the third electrode layer 70b, a fifth electrode layer 70c may be built on the fourth ferroelectric layer 72b, a sixth ferroelectric layer 72c may be built on the fifth electrode layer 70c, a seventh electrode layer 70d may be built on the sixth ferroelectric layer 72c, and so forth as desired. Any number (N) of alternating layers of ferroelectric composite 50 and conductive composite 52 may be built.

A removable conductive electric bus 80 is introduced during printing to electrically connect all previously printed electrodes layers 70 when processing the Nth ferroelectric layer 72. For example, the conductive electric bus 80 may electrically connect the conductive electrode layer 28 of the build plate 14 with the first electrode layer 70a, the third electrode layer 70b, the fifth electrode layer 70c, as so forth. Therefore, a high potential drop between the nozzle tip (1.5 kV) and the lower electrode layer (0 V) below the Nth ferroelectric layer 72 will produce a strong and concentrated electric field (3.5 kV/mm) to rapidly align the dipoles of the Nth extruded ferroelectric layer 72.

The created electric field is concentrated in the first nozzle 16 region and is shielded by the electrode layers 70 from influencing the polarity of the other previously printed ferroelectric layers 72. During printing, the first nozzle 16 tip has a temperature of over 200 degrees Celsius concentrated around the first nozzle 16 only, such that previously printed ferroelectric layers 72 are not heated (they stay around a temperature of 40-80 degrees Celsius) which is desired to maintain the oriented dipoles of the ferroelectric layers 72. Therefore, the temperature has minimum positive effect and electric field have minimal negative affect on the previously printed and aligned ferroelectric layers 72.

Following printing, the removable conductive electric bus 80 may be removed in order to isolate the intercalated electrodes layers 70 and achieve in-series connection of the ferroelectric layers 72.

Figure 4:
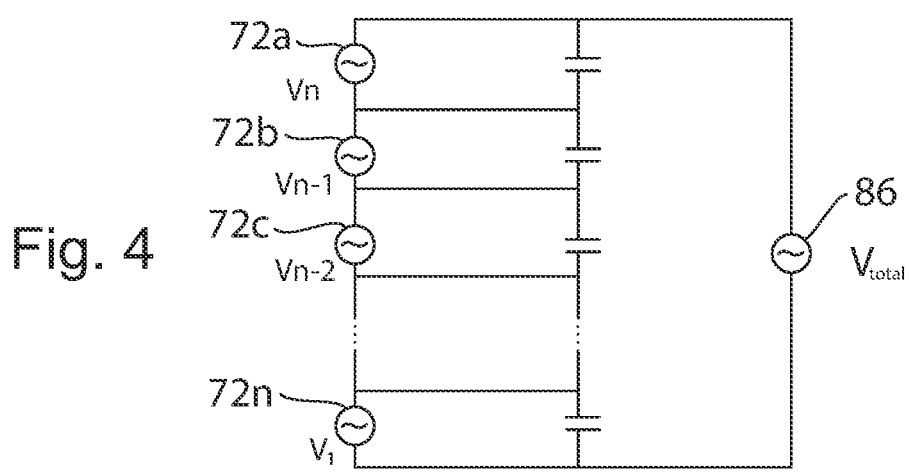
FIG. 4 is an exemplary electrical diagram of the arrangement of FIG. 3 with the electrical bus removed showing the configuration of multiple piezoelectric bulk substrates connected in series in order to increase the output voltage.

Referring to FIG. 4, the voltage output is the sum of the individual voltages contributed by each of the ferroelectric layers 72 arranged in series. For example, the cathode of the second ferroelectric layer 72a may be electrically connected to the anode of the fourth ferroelectric layer 72b, the cathode of the fourth ferroelectric layer 72b may be electrically connected to the anode of the sixth ferroelectric layer 72c, and so forth, and the anode of the second ferroelectric layer 72a and the cathode of the Nth ferroelectric layer 72n may be connected to an external load 86.

The voltage increases monotonically with the addition of each ferroelectric layer 72 to provide a total voltage ($V_n + V_{n-1} + V_{n-2} + \ldots + V_1 = V_{total}$) of the external load 86. The identical voltage output ($V_n = V_{n-1} = V_{n-2} = \ldots = V_1$), for example, between 7 to 10 V, of each ferroelectric layer 72 evidences the uniform strain distribution among each ferroelectric layer 72. The overall capacitance decreases with the addition of each ferroelectric layer 72. The current output remains relatively stable with the addition of each ferroelectric layer 72. The piezoelectric bulk structure 12 yields a stable current output that will be equal to the individual currents produced by each layer, therefore, current is independent of the number of ferroelectric layers 72.

Figure 5:
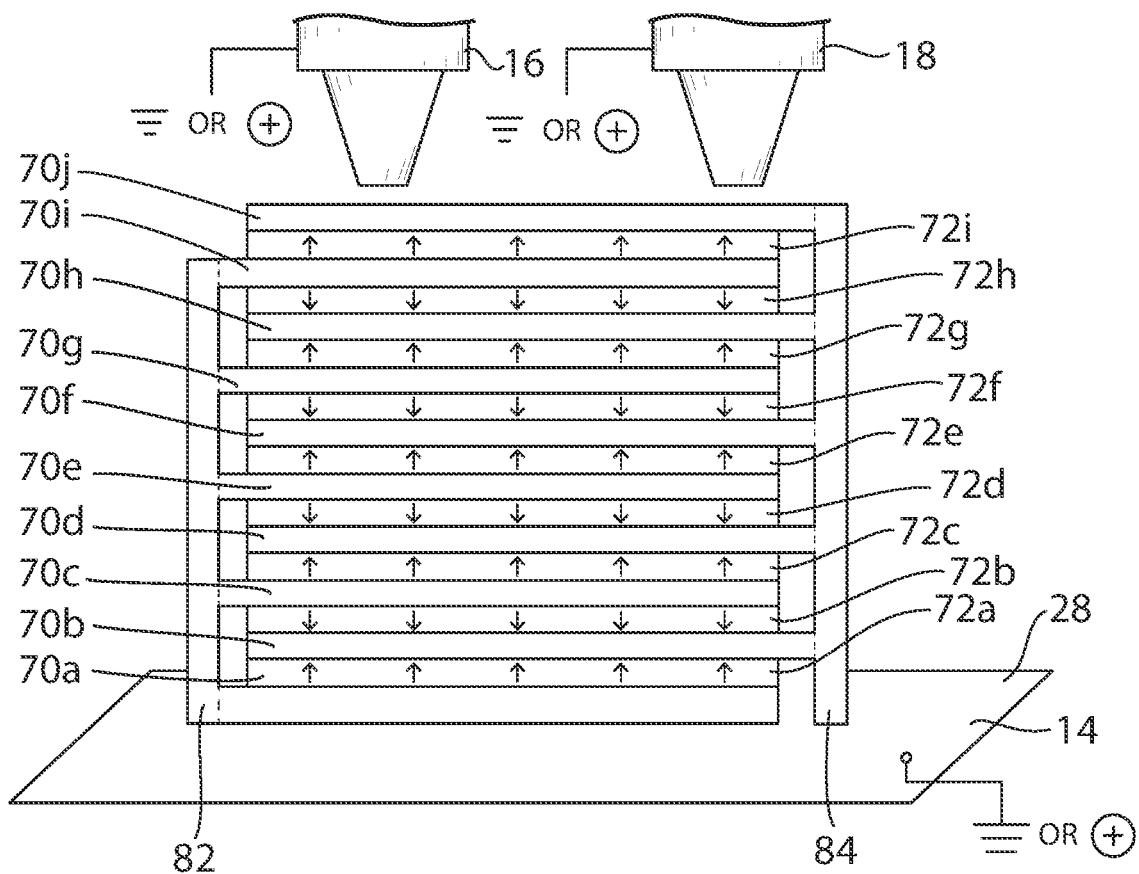
FIG. 5 is a schematic representation showing the multiple layers of conductive composite and ferroelectric composite being alternatingly deposited on the print bed and the ferroelectric composite being in-situ poled in alternating fashion such that adjacent conductive layers are oppositely poled and similarly charged conductive layers are attached to respective electrical buses.

Referring to FIG. 1 and FIG. 5, in an alternative embodiment of the present invention, the piezoelectric bulk structure 12 may be manufactured by the following process to produce an interdigital electrode configuration that allows for parallel connection of the ferroelectric layers 72.

The first filament 54 of ferroelectric composite 50 and the second filament 60 of conductive composite 52 may be loaded into the first and second nozzle 16, 18, respectively, of the 3D printing system 10.

Initially, the second nozzle 18 may deposit a bottom electrode layer 70a printed on the conductive electrode layer 28 of the build plate 14. A charge may not be applied to the second nozzle 18 in the deposition of the bottom electrode layer 70a. The bottom electrode layer 70a and the conductive electrode layer 28 electrically communicate, for example, a positive voltage or negative voltage, according to a switching schedule as will be described to conduct a charge between the bottom electrode layer 70a and the conductive electrode layer 28. Initially, for this example, the build plate 14 will be considered to have a negative relative voltage.

Next, the first nozzle 16 may deposit a second ferroelectric layer 72a printed on the top of the bottom electrode layer 70a. While the second ferroelectric layer 72a is printed on the top of the bottom electrode layer 70a, a positive voltage is applied between the first nozzle 16 with the negative voltage on the bottom electrode layer 70a. Facilitated by the high nozzle temperature, the electric field quickly aligns the dipoles in the just extruded material in-situ, giving rise to a large net polarization in the second ferroelectric layer 72a depicted by the upward arrow.

At the interface of the bottom electrode layer 70a and the second ferroelectric layer 72a, the hydroxyl surface of KNN in the ferroelectric layer forms hydrogen bonds with the PLA in the bottom electrode layer 70a forming a strong bond.

Next, the second nozzle 18 may deposit a third electrode layer 70b onto the second ferroelectric layer 72a. While the third electrode layer 70b is printed on the top of the second ferroelectric layer 72a, a positive voltage is applied to the second nozzle 18 with the negative voltage on the conductive electrode layer 28 in order to keep the dipole direction (upward arrow) in the second ferroelectric layer 72a. The third electrode layer 70b and the conductive electrode layer 28 electrical communicate, for example, the negative voltage. At this time, the voltage of the build plate 14 is reversed to be a positive voltage.

Next, the first nozzle 16 may deposit a fourth ferroelectric layer 72b printed on top of the third electrode layer 70b. However, unlike the embodiment shown in FIG. 3, when the fourth ferroelectric layer 72b is printed on the top of the third electrode layer 70b, the voltage on the nozzle 16 is made negative so that the electric field polarity between the first nozzle 16 and the third electrode layer 70b is reversed in order to realize the opposite piezoelectric polarization indicated by a down arrow. In this respect, the second ferroelectric layer 72a and the fourth ferroelectric layer 72b have opposite piezoelectric polarization.

Importantly, the created electric field, as the fourth ferroelectric layer 72b is printed, is concentrated in the first nozzle 16 region and is shielded by the third electrode layer 70b from influencing the polarity of the previously printed second ferroelectric layer 72a. The high temperature of the first nozzle 16 is also concentrated within the first nozzle 16 region, therefore, also maintaining the polarity of the second ferroelectric layer 72a.

Next, the second nozzle 18 may deposit a fifth electrode layer 70c onto the fourth ferroelectric layer 72b. While the fifth electrode layer 70c is printed on the top of the fourth ferroelectric layer 72b, a negative voltage is applied to the second nozzle 18 with the positive voltage on the conductive electrode layer 28 in order to keep the dipole direction (down arrow) in the fourth ferroelectric layer 72a. The fifth electrode layer 70c, the bottom electrode layer 70a, and the conductive electrode layer 28 electrical communicate, for example, the positive voltage. At this time, the voltage of the build plate 14 is reversed to be a negative voltage.

The deposition of alternating layers of ferroelectric composite 50 and conductive composite 52 is repeated to build an alternating layered piezoelectric substrate with alternate polarities. In this respect, a sixth ferroelectric layer 72c may be built on the fifth electrode layer 70c, a seventh electrode layer 70d may be built on the sixth ferroelectric layer 72c, and so forth. Any number (N) of alternating layers of ferroelectric composite 50 and conductive composite 52 may be built.

A pair of conductive electric buses 82, 84 are introduced to connect alternating previously printed electrode layers 70, respectively, during printing. The first electric bus 82 is introduced during printing to electrically connect the conductive electrode layer 28 of the build plate 14 with the first electrode layer 70a, the fifth electrode layer 70c, the ninth electrode layer 70e, and so forth. In this respect, the first electrode layer 70a, the fifth electrode layer 70c, the ninth electrode layer 70e, and so forth, will share a charge. The second electric bus 84 is introduced during printing to electrically connect the conductive electrode layer 28 of the build plate 14 with the third electrode layer 70b, the seventh electrode layer 70d, the eleventh electrode layer 70f, and so forth. In this respect, the third electrode layer 70b, the seventh electrode layer 70d, the eleventh electrode layer 70f, and so forth, will share a charge.

Following printing, the pair of conductive electric buses 82, 84 are retained on the piezoelectric bulk structure 12 to produce two electrodes with parallel connection of the alternating piezoelectric polarization charged ferroelectric layers 72.

Figure 6:
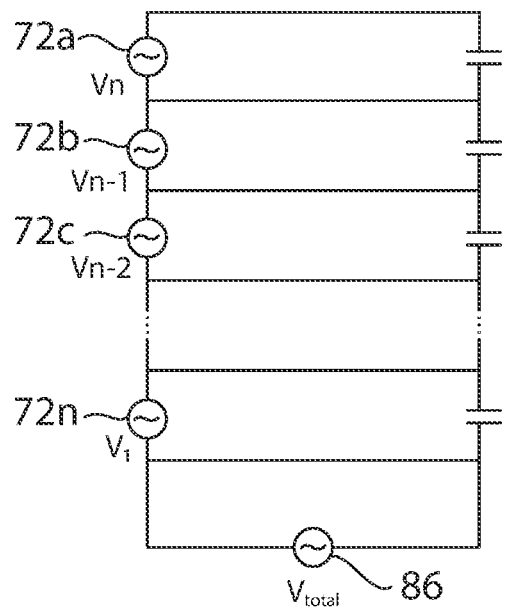
FIG. 6 is an exemplary electrical diagram of the arrangement of FIG. 5 with the electrical buses removed showing the configuration of multiple piezoelectric bulk substrates connected in parallel in order to increase the output current.

Referring to FIG. 6, the total current output is contributed by each of the ferroelectric layers 72 added together when the ferroelectric layer 72 are arranged in parallel. For example, the anode of the second ferroelectric layer 72a may be connected to the anode of the fourth ferroelectric layer 72b, the anode of the sixth ferroelectric layer 72c, and the anode of the Nth ferroelectric layer 72n. The cathode of the second ferroelectric layer 72a may be connected to the cathode of the fourth ferroelectric layer 72b, the cathode of the sixth ferroelectric layer 72c, and the cathode of the Nth ferroelectric layer 72n. The anode and cathode of the Nth ferroelectric layer 72n are connected to the external load 86.

The connection of each of the ferroelectric layers 72 results in a monotonic increase in the overall discharge current, where the contribution of each of the ferroelectric layer 72 is added to produce the overall discharge current. The overall capacitance increases with the addition of each ferroelectric layer 72. The output voltage remains relatively stable with the addition of each ferroelectric layer 72 ($V_n=V_{n-1}=V_{n-2}, \ldots, =V_1=V_{total}$). The piezoelectric bulk structure 12 yields a stable piezoelectric voltage output ($V_{total}$), for example, between 7 to 10 V, on the external load 68 which is independent of the number of ferroelectric layers 72.

Referring to FIGS. 3 and 5, and with respect to the embodiments described above, the $d_{33}$ coefficient increases monotonically with the addition of each ferroelectric layer 72. Accordingly, when subjected to an impulse force (e.g., 100N), the piezoelectric output increases linearly with each ferroelectric layer 72. The linear relationship is attributed to the uniform quality of each ferroelectric layer, where the generated charges are accumulated with minimal loss. Therefore, the $d_{33}$ coefficient exhibits a linear relationship with each ferroelectric layer (approximately 14 pC/N per layer) and, for example, at least 110 pC/N and at least 120 pC/N and at least 130 pC/N total piezoelectric effect at room temperature.

The ferroelectric layer 72 has tensile and compressive modulus over three times lower than the electrode layer 20, mimicking the mechanical property alteration of the soft and hard layers in nacres. The tensile/compressive mechanical moduli in the ferroelectric composite 50 may be between 0.3 GPa and 0.5 GPa and the tensile/compressive mechanical moduli in the conductive composite may be between 1.4 to 1.8 GPa. Strong bonding between the hard and soft layers help to achieve the desired toughness enhancement. The piezoelectric bulk structure 12 provides a fracture toughness of at least 5 MPa*m$^{1/2}$ and at least 5.5 MPa*m$^{1/2}$ and at least 5.51 MPa*m$^{1/2}$ which is 50% greater than the ferroelectric composite 50 and conductive composite 52 separately. This value is also higher than common ferroelectric ceramics such as PZT and barium titanate (BTO). Crack deflection (rather than straight crack propagation that results in brittleness) is provided by the ferroelectric composite 50 layer exhibiting elastomer-like behavior.

The following represent non-limiting examples of manufacture of the piezoelectric bulk structure 12 of the present application.

Example 1

Ferroelectric Particles, Composite and Filament Synthesis

The first filament 54 of ferroelectric composite 50 may be manufactured by uniformly mixing potassium carbonate (K2CO3, >99%, Sigma), sodium carbonate (Na2CO3, >99.5%, Sigma), lithium carbonate (Li2CO3, 99.999%, Strem Chemicals, Inc), and niobium oxide (Nb2O5, >99.9%, Alfa Aesar) in a molar ratio of 47:47:6:100. The mixture may be milled in 250 mL nylon jar with $ZrO_2$ balls for 6 hours through a laboratory planetary ball mill system (BM4X-V2.0L, Col-Int Tech, LLC), using ethanol as a medium. The mixture is then dried at 210° C. for 2 hours to remove absorbed moisture. The dried mixture is then calcined at 1100° C. in a Muffle furnace for 4 hours followed by slowly cooling down to room temperature to form high-purity ceramics.

Li—KNN ceramics are grinded to micro-particles by a SPEX 6875 Cryogenic Grinder. The micro-particles are first refluxed with $H_2O_2$ solution (30%) at 105° C. for 2 hours to add a hydroxyl group onto the surface. The collected samples through centrifuge are rinsed with deionized water for three times and then dried in an oven.

The surface-modified micro-particles are mixed with PVDF-HFP pellets (Solef 21508, PolyK Technologies, LLC). The mixture is added into N,N-dimethylformamide (DMF, >99.8%, Sigma) solvent at 80° C. for 3 hours with stirring to form a uniform solution (15 wt. % concentration) which are casted into glass dish to form a composite film after evaporating solvent at 70° C. overnight. The films are grinded into fine powders by a SPEX 6875 Cryogenic Grinder.

With grinded fine powders as raw materials, the first filament 54 with constant diameter around 2.6-2.8 mm is extruded through a customized single-screw polymer extruder (built based on Filastruder kit with 3.00 mm nozzle and 400 μm filter) with the temperature of header set at 170-230° C. and collect by a customized winder (built based on Filawinder kit) with spool. A laser sensor was utilized for filament diameter control.

Example 2

Conductive Composite and Filamant Synthesis

The second filament 60 is a mixture of carbon black (Ketjen Black, EC600JD) with polylactic acid (Natureworks 4043D PLA). With grinded fine powders as raw materials, the second filament 60 with constant diameter around 2.6-2.8 mm is extruded through a customized single-screw polymer extruder (built based on Filastruder kit with 3.00 mm nozzle and 400 μm filter) with the temperature of header set at 170-230° C. and collect by a customized winder (built based on Filawinder kit) with spool. A laser sensor was utilized for filament diameter control.

Example 3

Filament Extrusion and 3D Printing with Electric Poling

The first filament 54 and second filament 60 are extruded and the molten material 3D printed by a customized fused deposition modeling (FDM) 3D printer. An inner electric field is built by connecting the print core and printing bed covered with copper foil to a high voltage source (30 kV, 10 W). A thin layer of PVA (Elmer's Disappearing Purple Glue Stick) is applied on the copper foil to enhance the adhesion of first printing layer.

Example 4

Bulk Piezoelectric Structure

A 25-ferro-layered metamaterial was printed. This structure had an overall thickness of over 2.5 cm and exhibited a $d_{33}$ coefficient of over 130 pC/N, out-performing 3D printed PZT composite (~110 pC/N) that required long time post-fabrication corona poling. Under the same consecutive impulse force, a stable short-circuit current output of as high as 30.18 μA was recorded, with a corresponding charge output of ~19.72 nC from the ~1.8 cm² material surface. The open circuit voltage remained at a stable level of ~6.00 V.

By surveying the electrical output within a wide range of load resistant, the maximum instantaneous power was identified to be 78.34 μW (435.2 mW/m2) at a load of 220 kΩ (FIG. 2h). This power was more than one order of magnitude higher than other 3D printed energy harvesters/nanogenerators (such as BaTiO3-Poly(vinylidene fluoride-co-trifluoro-ethylene) (P(VDF-TrFE)) piezoelectric nanogenerator (14 mW/m2) and 3D printed triboelectric nanogenerator (23.94 to 31.39 mW/m2)).

The piezoelectric voltage could increase proportionally to the number of layers by connecting the ferroelectric/electrode layers in series.

Distinct tensile/compressive mechanical moduli were observed in the ferroelectric (0.34 GPa, 0.47 GPa) and electrode composites (1.70 GPa, 1.48 GPa).

Example 5

Artificial Bone

An artificial piezoelectric bone was fabricated from the piezoelectric bulk structure 12. The printed bone had the same anatomy of the proximal phalange of an index finger. Unlike most reported bone implants, this piezoelectric bone was able to generate piezoelectric potential in response to biomechanical stimuli, just like real bones do. In addition, it could be engineered to show anisotropic piezoelectricity as most natural bones by switching the printing/stacking direction. When the stacking direction was along the longitudinal direction, a gentle tapping at the tip of bone produced ~0.75 V output; while the same stimuli at the side yielded negligible electricity. For a bone printed along the short axis, stimuli at the tip yielded negligible output, but induced ~0.65 V voltage when applied toward the side of the bone. Such an anisotropy piezoelectricity offers a possibility of mimicking real bone geometrically and functionally, which is essential for tissue engineering.

The modulus of the printed bones could be readily tuned to match the values of natural bones by adjusting the layer thickness ratio. As the electrode layer increased from 0 to 100% of the entire structure, the compressive modulus was tuned from 0.47 GPa to 1.48 GPa, where equal thicknesses of ferroelectric and electrode layers (the ratio used in our artificial bones) yielded a compressive modulus of ~0.78 GPa. In natural bones, the trabecular bone (cancellous bone) has a much lower modulus (0.12 GPa to 1.1 GPa) than the cortical bone due to their significantly higher porosity. Analogously, introducing porosity would further lower the compressive modulus of printed bones to the same level (0.1-0.2 GPa), which could be readily achieved by the 3D printing technique. Higher modulus, to the level of cortical bone (10-20 GPa) could be achieved by selecting more rigid polymer matrixes (such as liquid crystal polymer with modulus over 10 GPa31) as the printing composite matrix.

It is understood that other useful applications of the piezoelectric bulk structure 12 are contemplated. For example, the piezoelectric bulk structure 12 may be used as sensors, actuators, energy harvesting devices, and voltage and power sources to generate electric energy, kinetic energy, etc.

In one embodiment of the present invention, the external electrical load 86 may be a sensor or a voltage meter such as a transducer used to transmit an electrical signal through the electrical connectors to actuate or produce a vibration response in the piezoelectric bulk structure 12.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What we claim is:
1. A piezoelectric material comprising:
    a structure having alternating layers of ferroelectric material and conductive material alternated along a build axis;
    a first electrode connected to at least a first layer of conductive material; and
    a second electrode connected to at least a second layer of conductive material different from the first layer of conductive material;
    wherein the ferroelectric material is electrically poled in a direction along the build axis; and
    wherein the ferroelectric material and conductive material are hydrogen bonded to provide an interface that is at least as strong as the ferroelectric and conductive materials individually.

2. The piezoelectric material of claim 1 wherein all layers of the ferroelectric material have a same poling polarity, and the first and second electrodes are top and bottom layers of the conductive material.

3. The piezoelectric material of claim 1 where alternate layers of the ferroelectric material have opposite poling polarity and the first and second electrodes are every other layer.

4. The piezoelectric material of claim 1 wherein the ferroelectric material has a piezoelectric coefficient of at least 130 pC/N at room temperature and the conductive material is at least twice as conductive as the ferroelectric material.

5. The piezoelectric material of claim 4 wherein the ferroelectric material has a fracture resistance of at least 5.5 MPa*m$^{1/2}$.

6. The piezoelectric material of claim 1 wherein the ferroelectric material comprises ferroelectric particles embedded in a polymer matrix.

7. The piezoelectric material of claim 6 wherein the ferroelectric particles are potassium sodium niobite (KNN) particles.

8. The piezoelectric material of claim 7 wherein the ferroelectric particles are lithium-doped potassium sodium niobite (Li—KNN) particles.

9. The piezoelectric material of claim 8 wherein the polymer matrix is poly(vinylidene fluoride)-co-hexafluoropropylene (PVDF-HFP).

10. The piezoelectric material of claim 6 wherein the polymer matrix is configured to hydrogen bond with hydroxyl groups of the ferroelectric material.

11. The piezoelectric material of claim 10 wherein the polymer matrix is polylactic acid (PLA).

12. The piezoelectric material of claim 11 wherein the conductive particles are carbon particles.

13. The piezoelectric material of claim 1 further comprising an electrical load electrically connected to the first and second electrodes and configured to receive a voltage between the first and second electrodes.

14. The piezoelectric material of claim 1 wherein the ferroelectric material has a tensile or compressive modulus that is at least three times lower than the conductive material.

* * * * *